(12) United States Patent
Shiobara et al.

(10) Patent No.: US 8,778,727 B2
(45) Date of Patent: Jul. 15, 2014

(54) METHOD OF MANUFACTURING ORGANIC ELECTROLUMINESCENCE DISPLAY DEVICE

(75) Inventors: Satoru Shiobara, Mobara (JP); Jun Kamatani, Tokyo (JP); Yosuke Nishide, Kawasaki (JP); Taro Endo, Kawasaki (JP); Tomoyuki Hiroki, Mobara (JP); Nobuhiko Sato, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 302 days.

(21) Appl. No.: 13/442,310

(22) Filed: Apr. 9, 2012

(65) Prior Publication Data

US 2012/0274807 A1    Nov. 1, 2012

(30) Foreign Application Priority Data

Apr. 27, 2011 (JP) ................. 2011-099394
Mar. 23, 2012 (JP) ................. 2012-068007

(51) Int. Cl.
*H01L 51/40* (2006.01)

(52) U.S. Cl.
USPC ............... 438/99; 438/780; 257/642

(58) Field of Classification Search
USPC ................... 257/642; 438/99, 780
See application file for complete search history.

(56) References Cited

U.S. PATENT DOCUMENTS

| | | | |
|---|---|---|---|
| 6,617,186 B2 | 9/2003 | Kashiwabara | |
| 7,220,998 B2 | 5/2007 | Kashiwabara | |
| 7,534,557 B2 | 5/2009 | Tachikawa et al. | |
| 7,615,388 B2 | 11/2009 | Kashiwabara | |
| 7,914,976 B2 | 3/2011 | Tachikawa et al. | |
| 8,021,203 B2 | 9/2011 | Kashiwabara | |
| 2005/0007015 A1* | 1/2005 | Yokoyama et al. | 313/506 |

FOREIGN PATENT DOCUMENTS

| | | |
|---|---|---|
| JP | 3839276 B2 | 11/2006 |
| JP | 4507759 B2 | 7/2010 |
| JP | 4544811 B2 | 9/2010 |

OTHER PUBLICATIONS

U.S. Appl. No. 13/418,692, filed Mar. 13, 2012.
U.S. Appl. No. 13/421,247, filed Mar. 15, 2012.
U.S. Appl. No. 13/426,076, filed Mar. 21, 2012.
U.S. Appl. No. 13/432,724, filed Mar. 28, 2012.
U.S. Appl. No. 13/444,395, filed Apr. 11, 2012.

* cited by examiner

*Primary Examiner* — Errol Fernandes
(74) *Attorney, Agent, or Firm* — Fitzpatrick, Cella, Harper & Scinto

(57) ABSTRACT

Provided is a method of manufacturing an organic electroluminescence display device including: an organic compound layer-forming step of forming an organic compound layer on a first electrode; a release layer-forming step of forming a release layer on the organic compound layer; a first processing step for the release layer of patterning the release layer; an organic compound layer-processing step of removing the organic compound layer in a region not covered with the release layer processed in the first processing step for the release layer; and a second processing step for the release layer of removing a part of the release layer, in which the release layer is a deposited film formed of a charge-transportable organic compound and is dissolved by a solvent containing an organic solvent miscible with water.

10 Claims, 6 Drawing Sheets

METHOD OF MANUFACTURING ORGANIC ELECTROLUMINESCENCE DISPLAY DEVICE

BACKGROUND OF THE INVENTION

1. Field of the Invention

The present invention relates to a method of manufacturing an organic electroluminescence (EL) display device.

2. Description of the Related Art

A generally known display device having organic EL elements mounted thereon is a device in which pixels each having a single or multiple organic EL elements are arranged in a predetermined pattern. By those pixels, a display region of the display device is two-dimensionally and finely divided. The organic EL elements included in the pixels are electronic elements which output, for example, any one of red light, green light, and blue light. A display device having organic EL elements mounted thereon obtains a full-color image by driving the organic EL elements for outputting desired colors at desired emission intensities.

By the way, in an organic EL element which is a component of a display device, an organic compound layer in the element is a thin film layer formed by forming a thin film made of an organic material by vapor deposition or the like. When the organic compound layer in the organic EL element of the display device is formed for each element by vapor deposition, a fine patterning technology is necessary. Upon performance of the patterning, a fine metal mask the fineness of which is according to the fineness of the patterning is necessary. However, a vapor deposited film which adheres when the metal mask is used repeatedly in vapor deposition may narrow an opening in the mask or stress may deform the opening in the mask. Therefore, it is necessary to clean the mask used after film formation for a fixed number of times, which is a disadvantageous factor from the viewpoint of manufacturing costs. Further, partly due to a limitation on the process accuracy of the mask, the pixel size has a limit of about 100 µm, which is disadvantageous to a finer size. Further, with regard to the substrate size, when a fine metal mask is increased in size, in order to secure the positional accuracy of the opening in the mask, it is necessary to enhance the stiffness of a frame of the mask. However, when the stiffness of the mask is enhanced, an increase in the weight of the mask itself is caused accordingly. Therefore, from the viewpoint of both processability and handling, when large format display devices of the fourth and subsequent generations are to be produced, an optimum production process of a fine organic EL element and a display device having the organic EL element mounted thereon has not taken shape at present.

Under those circumstances, a method of manufacturing a display device having a fine organic EL element without using a metal mask is proposed.

In the method proposed in Japanese Patent No. 3839276, a photoresist is directly formed on an emission layer. When the method is adopted, the photoresist to be used generally contains large amounts of a photoinitiator, a crosslinking agent, and the like. Here, the photoinitiator, the crosslinking agent, and the like are each a material for changing insolubility at least in a developer. In the method proposed in Japanese Patent No. 4507759, an intermediate layer formed of a water-soluble material is provided on an organic compound layer, and the organic compound layer is patterned by performing photolithography on the intermediate layer. Here, a water-soluble polymer for constituting the intermediate layer to be formed on an emission layer is generally insulative. In addition, Japanese Patent No. 4544811 proposes such a technology that a water-soluble polymer is used as a release layer and a photoresist is released together with the release layer.

The resist, the intermediate layer, the release layer, and the like are generally insulative. Accordingly, when any one of those layers is being left on the surface of the emission layer or the like of an organic EL element, the layer serves as a resistance to remarkably deteriorate the element characteristics of the organic EL element in an organic EL display device. Accordingly, the resist, the intermediate layer, the release layer, and the like need to be removed so that none of the layers may remain on the surface of the emission layer or the like. However, it is difficult to completely remove the resist, the intermediate layer, the release layer, and the like each formed of a polymer material, and hence the residue that cannot be completely removed remains in the device to some extent. Further, concern is raised about the deterioration of the element characteristics due to, for example, the following. A trace amount of an impurity in the resist, the intermediate layer, the release layer, or the like, or a solvent to be used upon application of the resist, the intermediate layer, the release layer, or the like diffuses to the emission layer or the like constituting the organic compound layer to cause the crystallization of the organic compound layer. Accordingly, the following problem has conventionally arisen. The element characteristics of an organic EL element in an organic EL display device produced by patterning involving utilizing a photolithography process are inferior to the element characteristics of organic EL elements formed like a pattern with a metal mask or the like in a vacuum in-situ fashion.

SUMMARY OF THE INVENTION

The present invention has been made to solve the problems, and an object of the present invention is to provide a method of manufacturing an organic EL display device including an organic EL element, which has element characteristics comparable to those of an organic EL element formed with a metal mask or the like in a vacuum in-situ fashion, while utilizing a patterning approach based on photolithography.

The method of manufacturing an organic EL display device of the present invention is a method of manufacturing an organic EL display device having an organic EL element including a first electrode and a second electrode, and an organic compound layer arranged between the first electrode and the second electrode, the organic compound layer being patterned, the method including: an organic compound layer-forming step of forming the organic compound layer at least on the first electrode; a release layer-forming step of forming a release layer on the organic compound layer; a first processing step for the release layer of patterning the release layer; an organic compound layer-processing step of removing the organic compound layer in a region not covered with the release layer processed in the first processing step for the release layer; and a second processing step for the release layer of removing a part of the release layer, in which the release layer includes a deposited film formed of a charge-transportable organic compound, and is soluble in a polar solvent.

According to the present invention, there can be provided a method of manufacturing an organic EL display device including an organic EL element, which has element characteristics comparable to those of an organic EL element formed with a metal mask or the like in a vacuum in-situ fashion, while utilizing a patterning approach based on photolithography.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

A method according to the present invention is a method of manufacturing an organic EL display device having an organic EL element formed of a first electrode and a second electrode, and an organic compound layer placed between the first electrode and the second electrode, the organic compound layer being patterned into a desired shape.

The manufacturing method of the present invention includes the following steps (A) to (E): (A) an organic compound layer-forming step of forming the organic compound layer on the first electrode; (B) a release layer-forming step of forming a release layer on the organic compound layer; (C) a first processing step for the release layer of processing the release layer into a desired shape; (D) an organic compound layer-processing step of removing the organic compound layer in a region not covered with the release layer processed in the first processing step for the release layer; and (E) a second processing step for the release layer of removing a part of the release layer.

In addition, in the present invention, the release layer is a deposited film formed of a charge-transportable organic compound, and is a thin-film layer soluble in a polar solvent. In general, the organic compound layer of the organic EL element is formed of a compound having a small solubility in a polar solvent. Therefore, in the step (E), the release layer can be selectively dissolved with nearly no dissolution of the organic compound layer. Further, the release layer remaining on the surface of the organic compound layer after the step (E) is a layer formed of the charge-transportable organic compound. Accordingly, even the formation of a layer constituting the organic EL element such as the second electrode thereon does not prevent the flow of charge. It should be noted that the method in the present invention preferably further includes the step of forming a layer containing an alkali metal after the step (E) (second processing step for the release layer).

Embodiment 1

Hereinafter, an embodiment of the present invention is described with reference to drawings. It should be noted that in the following description, a well-known technology or known technology in the technical field is applicable to a portion not specifically illustrated or described. In addition, embodiments to be described below are each merely one embodiment of the present invention, and the present invention is not limited thereto. In addition, the embodiments to be described below may be appropriately combined as long as the combination does not deviate from the gist of the present invention.

(Organic EL Display Device)

Figure 1:
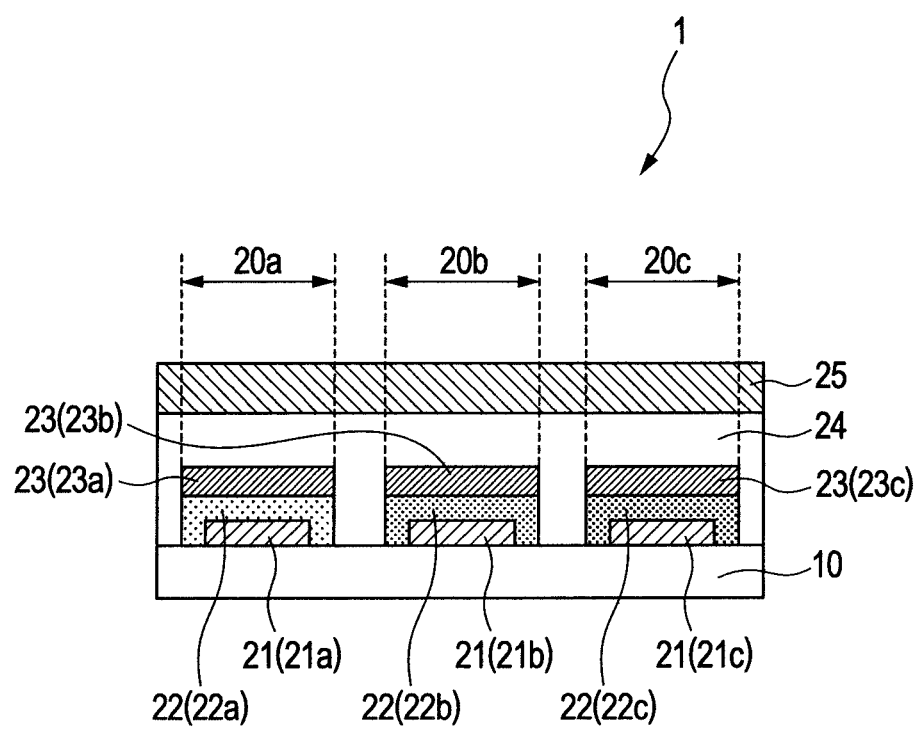
FIG. 1 is a schematic sectional view illustrating an example of an organic EL display device to be manufactured by a manufacturing method of the present invention.

FIG. 1 is a schematic sectional view illustrating an example of an organic EL display device to be manufactured by the manufacturing method of the present invention. An organic EL display device 1 of FIG. 1 has three kinds of sub-pixels, that is, a first sub-pixel 20a, a second sub-pixel 20b, and a third sub-pixel 20c provided on a supporting substrate 10. Here, a pixel is constituted of the first sub-pixel 20a, the second sub-pixel 20b, and the third sub-pixel 20c. Although one pixel formed of the first sub-pixel 20a, the second sub-pixel 20b, and the third sub-pixel 20c is illustrated in the organic EL display device 1 of FIG. 1, multiple pixels are placed in a matrix fashion on the supporting substrate 10 in an actual organic EL display device.

In addition, in the organic EL display device 1 of FIG. 1, each sub-pixel (20a, 20b, or 20c) has a first electrode 21, an organic compound layer 22, a charge transport layer 23, a charge injection/transport layer 24, and a second electrode 25.

The first electrode 21 (21a, 21b, or 21c) is an electrode layer (lower electrode) provided on the supporting substrate 10, and is separately provided for each sub-pixel. In addition, the first electrodes 21a, 21b, and 21c are each electrically connected to a switching element (not shown) such as a transistor.

The organic compound layer 22 (22a, 22b, or 22c) is a single layer formed of a predetermined organic compound or a laminate formed of multiple layers of such kind. It should be noted that the organic compound layer 22a, 22b, or 22c have at least an emission layer (not shown) for outputting light of any one of the colors including a red color, a green color, and a blue color.

The charge transport layer 23 (23a, 23b, or 23c) is provided for injecting or transporting a hole or electron injected from the second electrode 25 into the organic compound layer 22. In addition, in the organic EL display device 1 of FIG. 1, the charge transport layer 23a, 23b, or 23c is separately provided for each sub-pixel.

The charge injection/transport layer 24 is provided for injecting or transporting a hole or electron injected from the second electrode 25 into the organic compound layer 22 together with the charge transport layer 23. Although the charge injection/transport layer 24 is provided as a layer common to the respective sub-pixels (20a, 20b, and 20c) in the organic EL display device 1 of FIG. 1, the present invention is not limited thereto. In other words, the charge injection/transport layer 24 may be separately provided for each sub-pixel.

Although the second electrode 25 (upper electrode) is provided as a layer common to the respective sub-pixels (20a, 20b, and 20c) as in the charge injection/transport layer 24 in the organic EL display device 1 of FIG. 1, the present invention is not limited thereto. In other words, the second electrode 25 may be separately provided for each sub-pixel.

(Method of Manufacturing Organic EL Display Device)

Next, a method of manufacturing an organic EL display device including three kinds of sub-pixels for displaying colors different from one another is described as a specific example of the method of manufacturing an organic EL display device of FIG. 1 according to the present invention.

As described above, the method of manufacturing an organic EL display device of the present invention includes at least the following steps (A) to (E): (A) an organic compound layer-forming step of forming an organic compound layer on a first electrode; (B) a release layer-forming step of forming a release layer on the organic compound layer; (C) a first processing step for the release layer of processing the release layer into a desired shape; (D) an organic compound layer-processing step of removing the organic compound layer in a region not covered with the release layer processed in the first processing step for the release layer; and (E) a second processing step for the release layer of removing a part of the release layer.

Figure 2A:
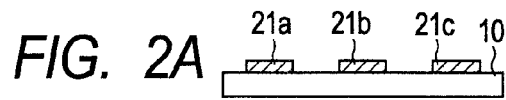
FIGS. 2A, 2B, 2C, 2D, 2E, 2F, 2G, 2H, 2I, 2J, 2K, 2L, 2M, 2N, and 2O are each a schematic sectional view illustrating Embodiment 1 in the method of manufacturing an organic EL display device of the present invention.
Figure 2B:
Figure 2C:
Figure 2D:
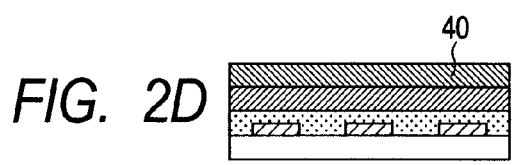
Figure 2E:
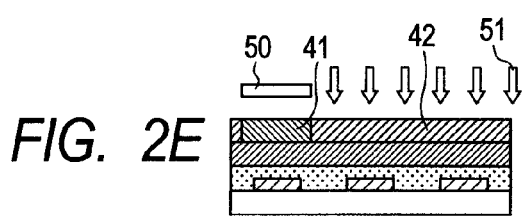
Figure 2F:
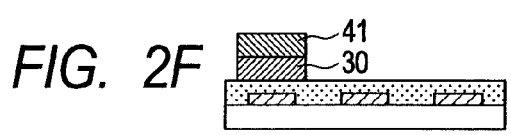
Figure 2G:
Figure 2H:
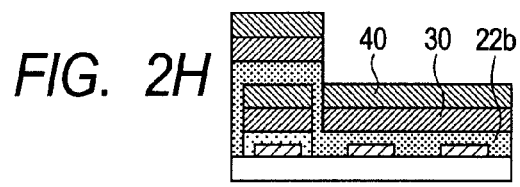
Figure 2I:
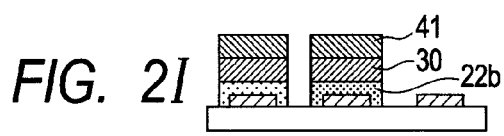
Figure 2J:
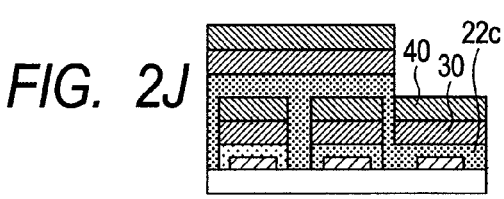
Figure 2K:
Figure 2L:
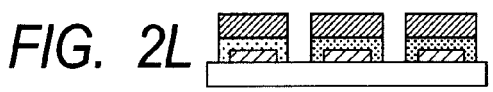
Figure 2M:
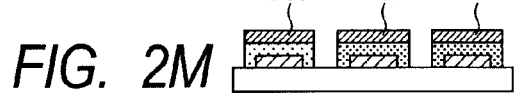
Figure 2N:
Figure 2O:
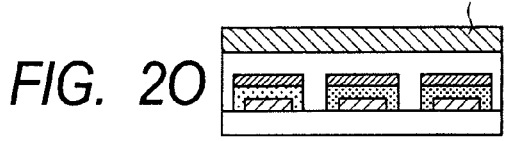

FIGS. 2A to 2O are each a schematic sectional view illustrating an example of a manufacturing process for the organic EL display device of FIG. 1. FIGS. 2A to 2O are each also a schematic sectional view illustrating Embodiment 1 in the method of manufacturing an organic EL display device of the present invention. Upon manufacture of the organic EL display device of FIG. 1, the organic EL display device is manufactured by, for example, the following steps: (1) the step of forming the first electrode (FIG. 2A); (2) the step of forming the organic compound layer (FIG. 2B); (3) the step of forming the release layer (FIG. 2C); (4) the step of forming a photosensitive resin layer (FIG. 2D); (5) the step of processing the photosensitive resin layer (FIG. 2E); (6) a first processing step for the release layer (FIG. 2F); (7) the step of processing the organic compound layer (FIG. 2G); (8) the step of removing the photosensitive resin layer (FIG. 2L); (9) a second processing step for the release layer (step of forming the charge transport layer) (FIG. 2M); (10) the step of forming the charge injection/transport layer (FIG. 2N); and (11) the step of forming the second electrode (FIG. 2O).

It should be noted that the steps (1) to (11) are merely specific examples, and the present invention is not limited to the mode. As the organic EL display device 1 of FIG. 1 requires the production of each of the three kinds of sub-pixels 20a, 20b, and 20c having different luminescent colors, the steps (2) to (7) need to be performed a total of three times after the performance of the step (1) before the performance of the step (8). For example, first, the organic compound layer 22a in the first sub-pixel 20a is formed by the steps (2) to (7) (FIG. 2G). Then, the organic compound layer 22b in the second sub-pixel 20b is formed by the steps (2) to (7) (FIG. 2H to FIG. 2I). After that, the organic compound layer 22c in the third sub-pixel 20c is formed by the steps (2) to (7) (FIG. 2J to FIG. 2K).

Next, each of the steps (1) to (11) is specifically described.

(Step of Forming First Electrode)

First, the first electrodes 21a, 21b, and 21c are formed on the supporting substrate 10. A known substrate such as a glass substrate can be selected as the supporting substrate 10. The first electrodes 21a, 21b, and 21c are electrode layers each formed of a known electrode material, and the constituent material is appropriately selected in correspondence with a light extraction direction. When a top emission type organic EL display device is produced, the first electrodes 21a, 21b, and 21c are reflecting electrodes, and the second electrode 25 to be described later is a light transmissive electrode. On the other hand, when a bottom emission type organic EL display device is produced, the first electrodes 21a, 21b, and 21c are light transmissive electrodes, and the second electrode 25 is a reflecting electrode.

When the first electrodes 21a, 21b, and 21c are formed as reflecting electrodes, the constituent material for each of the first electrodes 21a, 21b, and 21c is preferably a metal material such as Cr, Al, Ag, Au, or Pt. Of those metal materials, a material having a high reflectance is more preferred because the material can additionally improve light extraction efficiency. A reflecting electrode is separately formed for each sub-pixel by, for example, forming a thin film of the metal material by a known method such as sputtering and processing the thin film into a desired shape by means of photolithography or the like. It should be noted that a layer formed of an oxide semiconductor having light-transmitting property such as ITO or IZO may be further provided on the thin film formed of any such metal material by reason of, for example, the protection of the thin film or the regulation of a work function. Vapor deposition with a metal mask may also be utilized upon formation of the first electrodes 21a, 21b, and 21c. Even when the vapor deposition with a metal mask is performed, the first electrode 21a, 21b, or 21c is separately formed for each sub-pixel.

When the first electrodes 21a, 21b, and 21c are formed as light transmissive electrodes, examples of the constituent material for each of the first electrodes 21a, 21b, and 21c include oxide semiconductors having light-transmitting properties such as indium tin oxide (ITO) and indium zinc oxide.

(Step of Forming Organic Compound Layer)

The organic compound layer 22 (22a, 22b, or 22c) is a constituent member for the organic EL display device, and is a single layer, or a laminate formed of multiple layers, including at least an emission layer. A layer except the emission layer in the organic compound layer 22 is, for example, a hole injection layer, a hole transport layer, an electron blocking layer, a hole blocking layer, an electron transport layer, or an electron injection layer, provided that the present invention is not limited thereto. Here, a layer contacting the emission layer may be a charge transport layer (a hole transport layer or an electron transport layer), or may be a charge blocking layer (an electron blocking layer or a hole blocking layer).

In addition, a specific constitution of the organic compound layer 22 with respect to the first electrode 21 has only to be appropriately set in accordance with the kind of carrier to be injected from the first electrode 21 toward the organic compound layer 22. That is, when a hole is injected from the first electrode 21, while a layer for injecting or transporting a hole (a hole injection layer or a hole transport layer) is provided on the side of the first electrode 21, a layer for injecting or transporting an electron (an electron injection layer or an electron transport layer) is provided on the side of the second electrode 25. On the other hand, when an electron is injected from the first electrode 21, while a layer for injecting or transporting an electron (an electron injection layer or an electron transport layer) is provided on the side of the first electrode 21, a layer for injecting or transporting a hole (a hole injection layer or a hole transport layer) is provided on the side of the second electrode 25.

It should be noted that the organic compound layer 22 is preferably an amorphous film from the viewpoint of luminous efficiency. In addition, the thickness of each organic layer is preferably designed depending on a luminous wavelength in a proper fashion so that an optical interference effect may be obtained.

When one, or each of both, of a hole injection layer and a hole transport layer is provided, a hole-injectable/transportable material as a constituent material for the hole injection layer or the hole transport layer is not particularly limited, but a material having a work function at least smaller than that of a constituent material for the emission layer and having high hole-transporting property is preferably used. In addition, the hole injection layer or the hole transport layer may be provided with a function of blocking an electron flowing from the emission layer as well as a function of transporting a hole. Alternatively, separately from the hole injection layer or the hole transport layer, a layer having a function of blocking an electron flowing from the emission layer (electron blocking layer) may be inserted between the hole transport layer (or the hole injection layer) and the emission layer.

For example, an arylamine derivative, a stilbene derivative, a polyarylene, a condensed polycyclic hydrocarbon compound, a heterocyclic aromatic compound, a heterocyclic condensed polycyclic compound, and an organometallic complex compound, and homooligomers and heterooligomers thereof can each be used as an organic luminescence material of each color (red color/green color/blue color) in the emission layer, provided that the luminescence material in the present invention is not limited to the materials.

It should be noted that the luminescent colors of the emission layers in the three kinds of organic compound layers 22a, 22b, and 22c provided for the lower electrodes 21a, 21b, and 21c, respectively upon manufacture of the organic EL display device of FIG. 1 are a blue color, a red color, and a green color, respectively, i.e., the luminescent colors are different from one another. In addition, a combination of the luminescent colors is not particularly limited.

A constituent material for the hole blocking layer is not particularly limited as long as the material has an energy barrier for preventing the leak of a hole from the emission layer toward a cathode and has electron-transporting property.

In the present invention, a release layer needs to be selectively etched in the step of removing the release layer to be performed after the patterning of the organic compound layer. In view of the foregoing, the entirety of the organic compound layer 22 to be formed in the step of forming the organic compound layer is preferably a layer formed of a material having a lower solubility in a polar solvent than that of the release layer. Here, the organic compound layer 22 has at least the emission layer, and may further include a layer selected from a hole blocking layer, an electron blocking layer, a charge transport layer (a hole transport layer or an electron transport layer), and a charge injection layer (an electron injection layer or a hole injection layer). Here, the material having a low solubility in a polar solvent is specifically a condensed polycyclic hydrocarbon compound free of any m-terphenyl group.

Here, the condensed polycyclic hydrocarbon compound is a cyclic, unsaturated organic compound constituted only of a hydrocarbon. More specifically, the compound is a compound containing a condensed ring obtained by the condensation of at least one side of an aromatic ring such as a benzene ring. Specific examples of the condensed polycyclic hydrocarbon compound include naphthalene, fluorene, fluoranthene, chrysene, anthracene, tetracene, phenanthrene, pyrene, and triphenylene.

However, it is hard to utilize the condensed polycyclic hydrocarbon compound as a constituent material for the organic compound layer because the compound has low heat stability when used as it is. Therefore, a compound obtained by adding a substituent to such condensed polycyclic hydrocarbon compound is used as a constituent material for the organic compound layer.

Here, a compound as a constituent material for, in particular, the uppermost layer of the organic compound layer is preferably an organic compound obtained by the bonding of the multiple condensed polycyclic hydrocarbon compounds with a single bond. The organic compound contains a compound obtained by appropriately substituting the condensed polycyclic hydrocarbon compound as a main skeleton with an alkyl group such as a methyl group or an ethyl group. Such organic compound has a particularly low solubility in a polar solvent because the compound does not contain, in its main chain or a substituent thereof, any compound having a heteroatom (such as N or O).

A layer formed of the aromatic hydrocarbon compound has charge-transporting property. Here, the term "charge-transporting property" refers to the property by which a current can be flowed. Specifically, not only the electron transport layer or the hole transport layer but also the electron injection layer, the hole injection layer, the blocking layer, or the like is included in the layer having charge-transporting property.

It should be noted that an existing method such as a vacuum deposition method, a spin coating method, a dip coating method, or an ink jet method can be employed as a method of forming the layer formed of the aromatic hydrocarbon compound. The film forming-method is more preferably the vacuum deposition method in consideration of the emission characteristic of the organic EL display device.

(Step of Forming Release Layer)

A release layer 30 to be provided on the organic compound layer 22 may be a single layer, or may be a laminate formed of multiple layers. In the present invention, when the release layer 30 is formed of a single layer, the layer is a deposited film formed of a material soluble in a polar solvent. Alternatively, when the release layer 30 is a laminate formed of multiple layers, at least the lowermost layer out of the layers constituting the laminate is a layer formed of a low-molecular weight material formed into a film by the vacuum deposition method. More specifically, the lowermost layer of the release layer 30 is a deposited film formed of the material soluble in the polar solvent. As a result, the use of the polar solvent enables selective removal of the release layer 30. In addition, the release layer 30 in the present invention is preferably an amorphous film.

Here, the reason why the release layer 30 (or at least the lowermost layer thereof) is a deposited film formed of the material soluble in the polar solvent by the vacuum deposition method is described.

A material to be formed into a film by the vacuum deposition method is naturally limited to a low-molecular weight compound having sublimation property because the vacuum deposition method is a thin film-forming method applied to a compound having high sublimation property. The compound having high sublimation property is specifically a compound that sublimates under a pressure of $10^{-4}$ Pa to $10^{-5}$ Pa at a temperature of 400° C. or less. In addition, the molecular weight of the compound in the deposited film is small as compared with that of a polymer material, and hence an interaction (intermolecular force) between molecules constituting the deposited film is weak and their adsorption forces to the organic compound layer 22 are also weak. Further, the states of the molecules in the deposited film formed in an amorphous state such as the orientations of the molecules with respect to each other are random. As a result, an intermolecular distance becomes large as compared with those in a solid state and a crystalline state, and hence a state where the molecules are spread out and a solvent molecule is easy to enter, that is, a state where the molecules are easily dissolved is established. Accordingly, such deposited film (of the organic compound) formed by the vacuum deposition method is etched from its surface in a substantially uniform fashion by being brought into contact with a solvent containing the polar solvent, and hence a desired thickness of several nanometers to several tens of nanometers can be left.

On the other hand, when the release layer is a polymer material, it is difficult to remove the release layer while leaving the desired thickness of several nanometers to several tens of nanometers. For example, when a conductive water-soluble polymer is used in the release layer, an altered layer having a low solubility is formed at an interfacial region by bake drying after application, and hence it is difficult to uniformly etch the release layer. In addition, a π-conjugated polymer or the like to be used in the emission layer or the like as well cannot be formed into the release layer because the solvent of an application liquid causes the dissolution of the organic compound layer as a lower layer upon application of the material.

In the second processing step for the release layer to be described later, the polar solvent to be used for removing a part of the release layer is preferably used. In addition, the polar solvent to be used for removing a part of the release layer is more preferably a mixed solvent obtained by mixing an organic solvent miscible with water and water. Multiple kinds of organic solvents miscible with water may be used.

Here, examples of the polar solvent include alcohols, polyhydric alcohols, ketones, esters, pyridines, and ethers, provided that the solvent used in the second processing step for the release layer to be described later needs to be removed by being volatilized after the performance of the second processing step. Accordingly, the boiling point of the organic solvent to be used is preferably at least lower than the decomposition temperature or glass transition temperature of the organic compound in the organic compound layer 22. When description is given by taking the alcohols as specific examples, alcohols each having a small number of carbon atoms such as methanol, ethanol, and isopropyl alcohol are preferred because of their low boiling points.

A cause for the occurrence of a difference between the etching rates of films formed of various compounds for the polar solvent, that is, a difference in solubility can be considered to be as described below.

The compounds listed as polar solvents each necessarily contain a heteroatom in a molecule thereof, and the heteroatom functions as a polar site of a compound molecule of interest. Then, the polar site interacts with a polar site in a constituent material for the release layer, and hence the constituent material for the release layer is dissolved in the polar solvent. In addition, the interaction between the polar sites affects the solubilities of various compounds in the polar solvent. In consideration of the foregoing, the solubility of the lowermost layer of the release layer in a solvent formed of the polar solvent can be improved as compared with the solubility of the organic compound layer therein by appropriately selecting the polar solvent while taking into consideration the structure of the compound to be used as the constituent material for the release layer 30.

Therefore, the release layer 30 can be selectively dissolved by appropriately selecting the constituent material for the release layer 30 in consideration of the interaction between the polar site in the compound to serve as the constituent material for the release layer 30 and the polar site of the solvent molecule in addition to the boiling point of the polar solvent.

By the way, a compound that dissolves in the polar solvent is specifically a heterocyclic compound, or an organic compound having an electron-donating or electron-withdrawing substituent.

(1) Heterocyclic Compound Having Charge-Transporting Property

In the present invention, a heterocyclic compound may be used as the constituent material for the release layer 30. In the present invention, a heterocyclic compound excellent in charge-transporting property is suitably used. Examples thereof include a group of compounds each containing, as a basic skeleton, a heterocyclic compound such as pyridine, bipyridine, triazine, phenanthroline, quinoline, imidazole, oxazole, thiazole, oxadiazole, and thiadiazole. It should be noted that when such compound contains quinoline as a basic skeleton, the compound may be a quinolinate complex. Compounds included in the compound group of heterocyclic compounds are, for example, the following compounds.

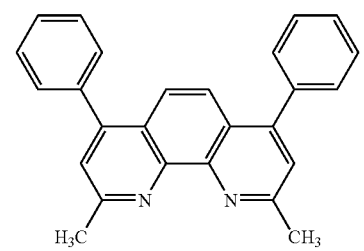

A1

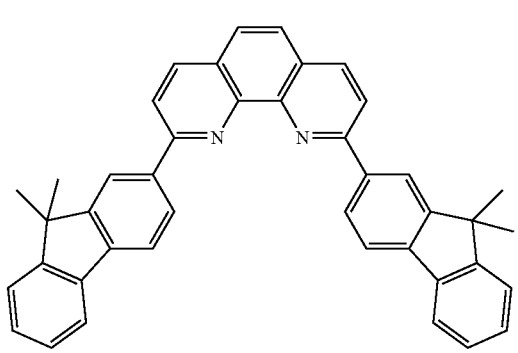

A2

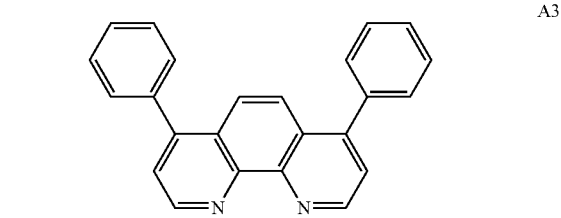

A3

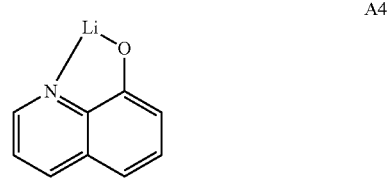

A4

-continued

A5
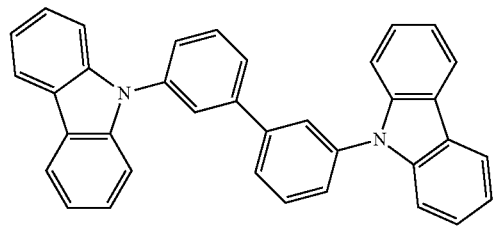

A6
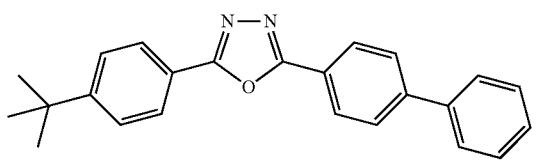

A7
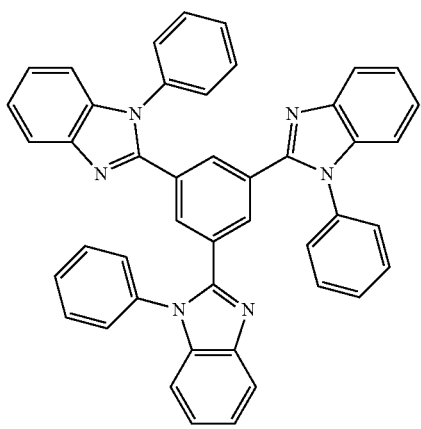

(2) Group of Compounds Each Having M-Terphenyl Group and Condensed Ring Group

In the present invention, a compound having an m-terphenyl group and a condensed ring group may be used as the constituent material for the release layer 30. The presence of an m-terphenyl group improves its solubility in the polar solvent, provided that the release layer needs to be improved in terms of its heat stability such as a glass transition temperature as well as of the solubility in the polar solvent. Accordingly, a compound obtained by combining an m-terphenyl group with a condensed polycyclic hydrocarbon compound is preferably used as the constituent material for the release layer 30. Examples of the compound having an m-terphenyl group and a condensed ring group include the following compounds.

B1
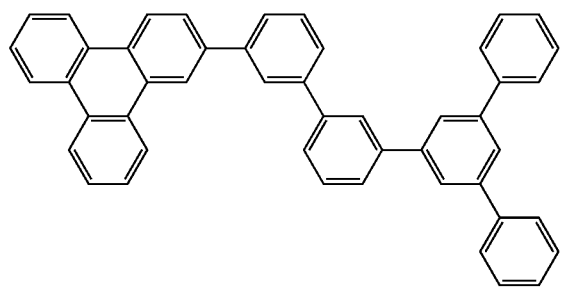

-continued

B2
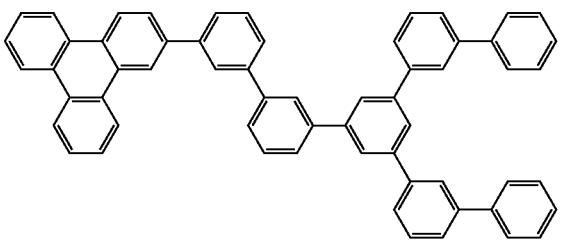

B3
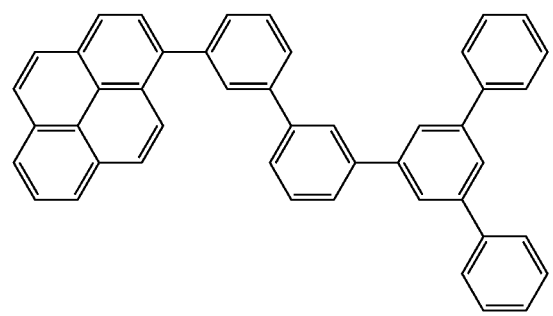

B4
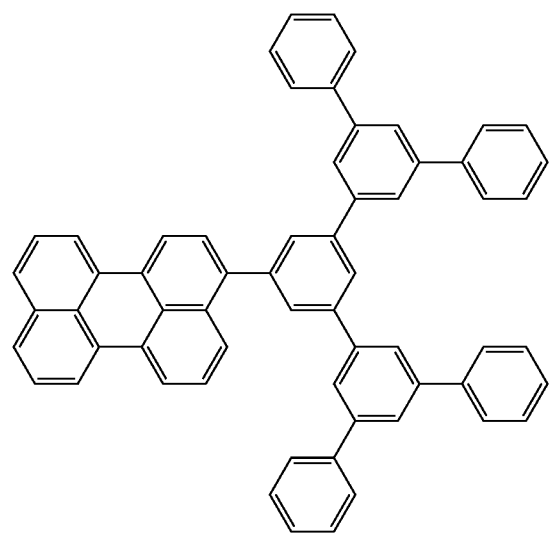

B5
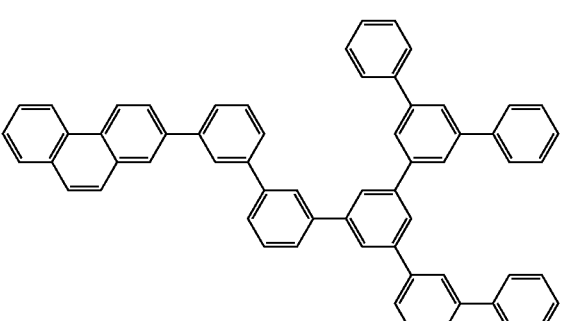

(3) Group of Charge-Transportable Compounds Each Having Electron-Withdrawing Group In the present invention, a charge-transportable compound having an electron-withdrawing group may be used as the constituent material for the release layer 30. Here, examples of the electron-withdrawing group include a ketone group and a cyano group. Examples of the compound having an electron-withdrawing group include the following compounds.

polarity of an entire molecule is caused by the localization of negative charge on the nitrogen atom. Here, it is assumed that

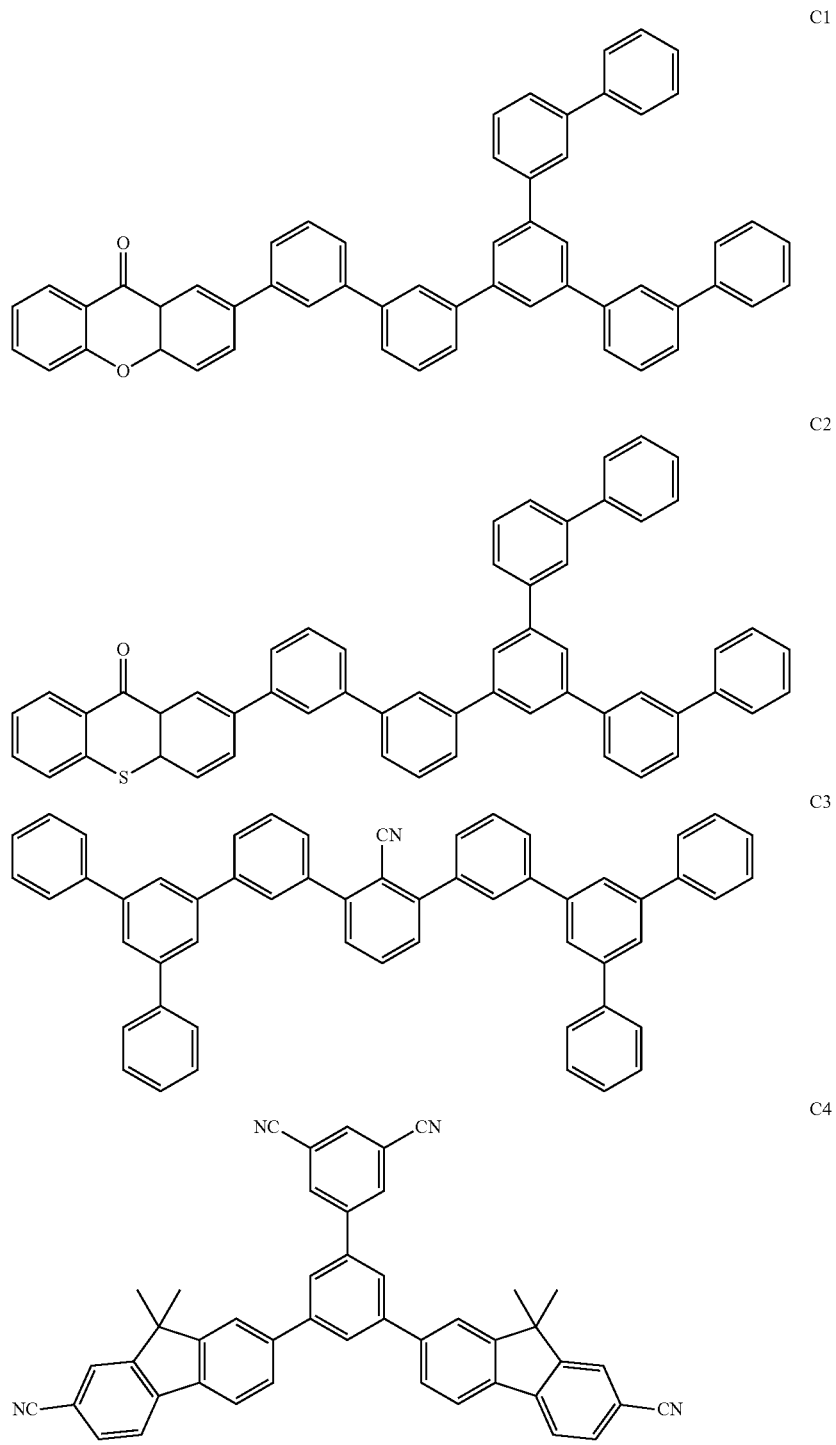

Of the three kinds of compound groups, one kind may be used alone, or two or more kinds thereof may be appropriately used in combination from the viewpoint of an improvement in solubility in the polar solvent.

In a heterocyclic compound, charge is localized on a heteroelement except carbon (such as N, O, or S). In the case of, for example, pyridine having a nitrogen atom in its ring, the an organic solvent (miscible with water) containing a hydrogen atom of a hydroxyl group (—OH) or the like on which positive charge is localized is interposed. As a result, a hydrogen bond is formed between the site (N atom) which the heterocyclic compound has and on which negative charge is localized, and the hydrogen atom in a polar solvent molecule on which positive charge is localized. When the hydrogen bond is formed as described above, the heterocyclic compound dissolves, or becomes easily soluble, in the polar solvent.

Similarly, a compound whose polarity is caused by the fact that the compound contains at least a heteroatom (such as N, O, or S) has improved solubility in the polar solvent as compared with that of a condensed polycyclic hydrocarbon compound.

For example, the bias of π-electrons occurs in a compound obtained by introducing an electron-withdrawing group or an electron-donating group into an aromatic ring, thereby causing polarization. Here, when an electron-withdrawing substituent is introduced, negative charge is localized on the substituent to cause polarity. When an electron-donating substituent is introduced, positive charge is localized on the substituent to cause polarity. The occurrence of the polarity enables an interaction with a solvent molecule of the polar solvent, thereby improving the solubility in the organic solvent.

On the other hand, the size of a molecule itself of an aromatic hydrocarbon compound free of any condensed ring, specifically, such a compound that benzene rings are linked to each other with a single bond is small as compared with that of a condensed polycyclic hydrocarbon compound. As a result, the former compound has improved solubility in the polar solvent as compared with that of the condensed polycyclic hydrocarbon compound. Molecules each having an m-terphenyl structure are of structures particularly hard to crystallize because the molecules are of such structures as to hardly orient with respect to each other. As a result, the solubility in the polar solvent is additionally improved.

In view of the foregoing discussion, a compound belonging to any one of such compound groups as described below is preferably used as a material suitable for the release layer to be used in the present invention, the material having charge-transporting property and good solubility. However, the material is not limited to the following examples as long as the material follows the discussion.

Here, a difference between the solubilities of the constituent material for the organic compound layer and the constituent material for the release layer in the polar solvent is described. Description is given by taking, as specific examples, the etching rates of: the following compound 1 as a compound having a condensed polycyclic hydrocarbon free of any m-terphenyl structure to be used as the constituent material for the organic compound layer; and the following compound A2 to be used as the constituent material for the release layer.

Compound 1

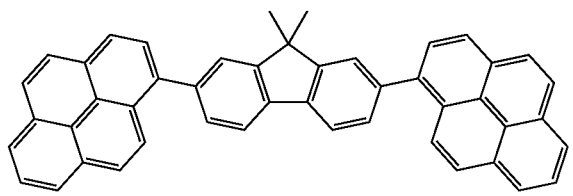

Compound A2

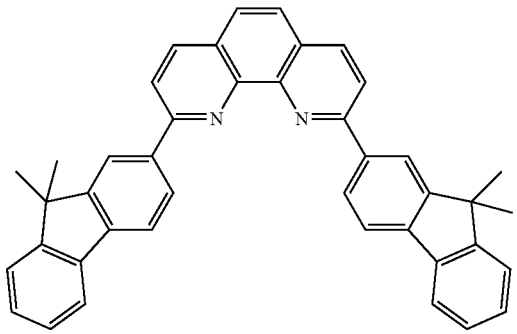

In the present invention, a larger etching rate means a higher dissolution rate. In addition, a larger etching rate means a higher solubility of a layer having a material of interest in the solvent (polar solvent).

Figure 3:
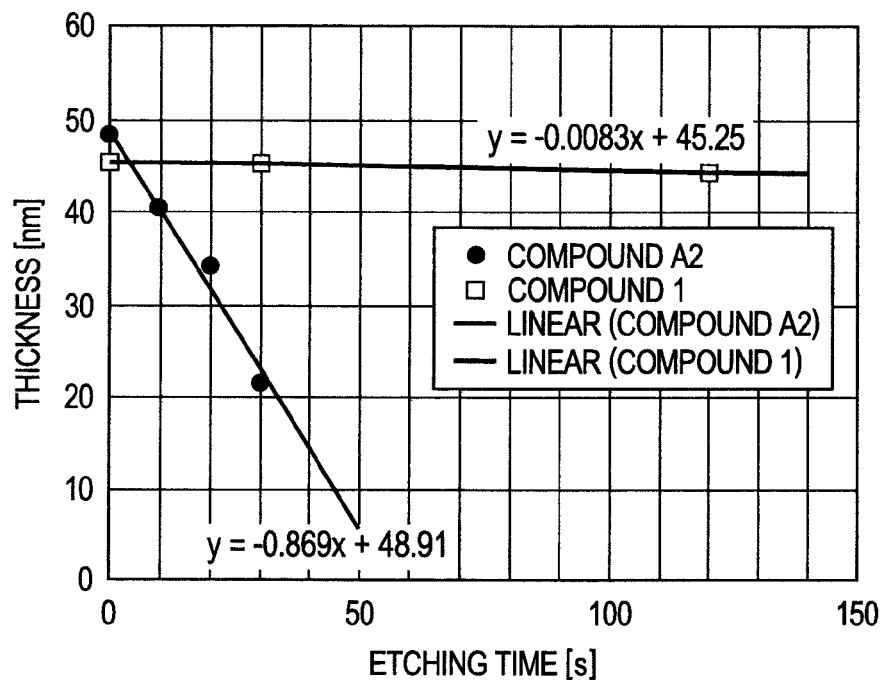
FIG. 3 is a graph illustrating thickness changes in a compound 1 and a compound A2 over an etching time.

FIG. 3 is a graph illustrating thickness changes in the compound 1 and the compound A2 over an etching time. Here, FIG. 3 illustrates the results of the etching of the respective layers when a mixed solvent obtained by mixing isopropyl alcohol (IPA) and water so that IPA may account for 60 wt % (hereinafter, sometimes referred to as "IPA/water mixed solvent") is used as a solvent formed of a polar solvent.

As can be seen from FIG. 3, a layer (layer A) formed of the compound 1 as a condensed polycyclic hydrocarbon compound free of any m-terphenyl structure shows nearly no thickness reduction even when the etching time is lengthened. On the other hand, the thickness of a layer (layer B) formed of the compound A2 as a heterocyclic compound reduces over time. When the etching rates of the respective layers are calculated with their etching conditions made identical to each other, the etching rate of the layer A is 0.008 nm/sec but the etching rate of the layer B is 0.87 nm/sec, that is, a ratio of the latter to the former is about 100.

Here, a ratio (n) between the etching rates of the organic compound layer (corresponding to the layer A) and the release layer (corresponding to the layer B) by the polar solvent can be represented like the following equation.

$$n = \frac{[\text{Etching rate of release layer}]}{[\text{Etching rate of organic compound layer}]}$$

It should be noted that the organic compound layer described in the equation includes, for example, a hole blocking layer, an emission layer, an electron blocking layer, or a hole transport layer. In the present invention, n needs to be at least larger than 1. n is preferably larger than 10 (n>10). Here, when the compound 1 is used in the uppermost layer of the organic compound layer and the compound A2 is used in the (lowermost layer of the) release layer, n becomes about 100. Accordingly, when the constituent material for the uppermost layer of the organic compound layer and the constituent material for the (lowermost layer of the) release layer are selected in consideration of the solubility of each material in the polar solvent, an etching rate ratio between both layers can be increased. As a result, selective removal of the release layer with the polar solvent is enabled. Therefore, the organic compound layer 22 is protected from elution toward the polar solvent or damage due to, for example, the permeation of the solvent. In addition, when an end portion of a film is exposed, such a relationship that n is at least larger than 10 in the equation is preferably satisfied for each of all layers in the organic compound layer 22 in order that an end portion of the organic compound layer 22 may be prevented from being eluted by the solvent formed of the polar solvent.

Figure 4:
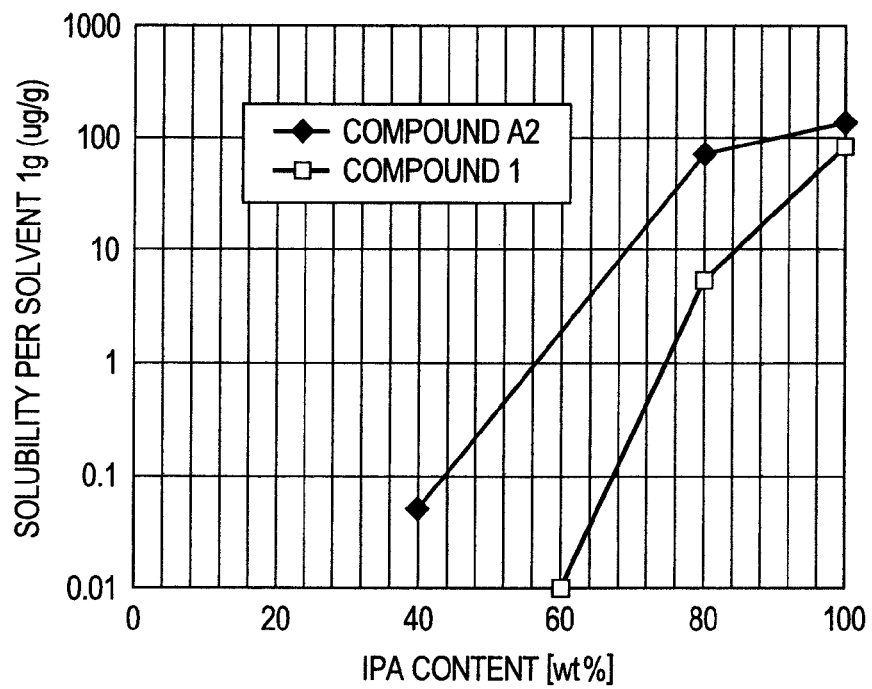
FIG. 4 is a graph illustrating the solubilities of a condensed polycyclic hydrocarbon compound (compound 1) and a heterocyclic compound (compound A2) in an IPA/water mixed solvent (water polar solvent).

The solubility of a compound as a constituent material for each layer in the IPA/water mixed solvent varies depending on the weight ratio of IPA in the mixed solvent. FIG. 4 is a graph illustrating the solubilities of the compound 1 (condensed polycyclic hydrocarbon compound) and the compound A2 (heterocyclic compound) in the IPA/water mixed solvent (polar solvent). Here, in the graph of FIG. 4, the axis of abscissa indicates the weight percent concentration of IPA in the IPA/water mixed solvent, and the axis of ordinate indicates the amount of the condensed polycyclic hydrocarbon compound or heterocyclic compound to dissolve in 1 g of the solvent. As can be seen from FIG. 4, while the amount in which the compound 1 (condensed polycyclic hydrocarbon compound) dissolves in 1 g of the IPA/water mixed solvent having an IPA concentration of 80 wt % is 5 µg, the dissolution amount of the compound A2 (heterocyclic compound) is 73 µg.

The graph of FIG. 4 is also a graph that proves the following items (i) and (ii): (i) when the concentration of IPA in the IPA/water mixed solvent is excessively high, both the constituent material for the release layer and the constituent material for the organic compound layer dissolve in the IPA/water mixed solvent at so high rates that a situation in which the etching rate ratio (n) is close to 1 is established; and (ii) in the case of the item (i), adding water to reduce the concentration of IPA can enlarge the etching rate ratio (n) while reducing the dissolution rates of the respective materials.

In such case, water is preferably incorporated into the solvent. Specifically, the water content is preferably regulated in an appropriate fashion so that the etching rate of the release layer may be even larger than that of the organic compound layer. The water content is more preferably regulated in an appropriate fashion so that the etching rate ratio (n) of the release layer to the layer positioned at the uppermost layer in the organic compound layer may exceed 10. As a result, a more selective removal of the release layer is enabled and hence reductions in the characteristics of the organic EL display device can be prevented.

(First Processing Step for Release Layer)

In the present invention, a photolithography method can be utilized as means for patterning (processing) the release layer 30 into a desired shape. Here, a processing process for the release layer involving utilizing the photolithography method (first processing step for the release layer) is described.

(i) Steps of Forming and Processing Photosensitive Resin Layer

When the photolithography method is utilized, a photosensitive resin layer 40 needs to be provided on the release layer 30 first. A known material can be used as a photosensitive resin as a constituent material for the photosensitive resin layer 40. In addition, an existing method such as a spin coating method, a dip coating method, or an ink jet method can be employed as a method of forming the photosensitive resin layer 40. A vacuum deposition method can be utilized in some situations.

After the formation of the photosensitive resin layer 40, the photosensitive resin layer 40 is processed. Here, the step of processing the photosensitive resin layer 40 is divided into the exposure of the photosensitive resin layer (exposing step) and the development of the photosensitive resin layer (developing step).

Here, an existing photoirradiation apparatus can be used in the exposing step. It should be noted that an exposure apparatus in accordance with the fineness of a mask pattern has only to be used. In addition, upon performance of the exposing step, a photomask 50 having an opening is used in a region to be exposed. It should be noted that a photomask having a light-shielding region formed of a Cr thin film to be generally used can be used as the photomask. Meanwhile, ultraviolet light or visible light can be utilized as light with which the photosensitive resin layer 40 is irradiated in the exposing step.

By the way, upon performance of the exposing step, the exposure region of the photosensitive resin layer 40 is desirably determined in consideration of the nature of the photosensitive resin as the constituent material for the photosensitive resin layer 40. Specifically, when a positive photosensitive resin is used, a region from which one wishes to remove the photosensitive resin layer 40 in the next developing step is defined as the exposure region. On the other hand, when a negative photosensitive resin is used, a region where he or she wishes to leave the photosensitive resin layer 40 when the next developing step is performed is defined as the exposure region. Here, FIG. 2E illustrates the case where a positive photosensitive resin is used. In FIG. 2E, a region 42 out of the photosensitive resin layer 40 irradiated with ultraviolet light 51 is removed in the next developing step. Meanwhile, a region 41 shielded from the ultraviolet light with the photomask 50 serves to protect the organic compound layer 22a provided for a predetermined region (the first sub-pixel 20a) in the step of processing the release layer or the step of processing the organic compound layer to be performed later.

Upon performance of the developing step, a developer suitable for the photosensitive resin as the constituent material for the photosensitive resin layer 40 has only to be used.

(ii) First Processing Step for Release Layer

Next, the release layer 30 is processed by selectively removing a region out of the release layer 30 not covered with the photosensitive resin layer 40. Although a method of selectively removing the release layer 30 is not particularly limited, specifically, an existing thin film-processing method such as wet etching or dry etching can be employed, provided that the dry etching is preferred because an influence of side etching by a solvent is smaller than that of any other method.

In the foregoing description, a photolithography process involving using a photoresist is utilized as means for processing the release layer 30, but a method of processing the release layer 30 is not limited thereto. For example, the release layer may be patterned into a desired shape by utilizing an ink jet mode, printing, laser processing, or the like. In this case, the release layer patterned into the desired shape can be formed without the formation of any photoresist. Accordingly, it is recommended that the release layer 30 be utilized as an etching mask upon processing of the organic compound layer in the next step (step of processing the organic compound layer). It should be noted that upon utilization of the release layer 30 as an etching mask, the thickness of the release layer 30 is preferably at least larger than that of the organic compound layer. In addition, no fine metal mask is used in the manufacturing method of the present invention, and hence such a high fineness that a pixel size is about 10 µm can be achieved. Therefore, the manufacture of an organic EL display device having a large supporting substrate size in its fifth generation and afterward can be realized.

(Step of Processing Organic Compound Layer)

Next, the organic compound layer 22 in a region out of the organic compound layer 22 not covered with the release layer 30 is selectively removed. A method of processing the organic compound layer 22 is not particularly limited, and an existing method such as wet etching or dry etching can be employed, provided that the dry etching is preferred because no concern is raised about side etching by a solvent.

Through the foregoing process, the organic compound layer can be formed so as to be selectively provided only for a predetermined sub-pixel. In addition, the organic compound layer desired only for each sub-pixel can be selectively formed in the sub-pixel by repeatedly performing the steps ranging from the step of forming the organic compound layer to the step of processing the organic compound layer described above a number of times corresponding to the number of kinds of sub-pixels.

(Second Processing Step for Release Layer)

Next, part of the release layer 30 is removed so that thinning may be performed (the release layer 30 may be processed into a thin shape). The second processing step is specifically the step of immersing the supporting substrate 10 on which the layers up to the release layer 30 have been formed in a polar solvent mixed with water after the step of processing the organic compound layer. Here, when the supporting substrate 10 on which the layers up to the release layer 30 have been formed is immersed in the polar solvent mixed with water, the release layer 30 is gradually dissolved from the opposite side of the supporting substrate 10. Here, the supporting substrate 10 on which the layers up to the release layer 30 have been formed is immersed for a certain time period under the condition of the following etching rate. An etching rate determined in advance from the amount of the constituent material for the release layer 30 eluted at the time of the immersion in the solvent to be used in the step for the certain time period (elution amount) is used. As a result, the release layer 30 can be processed into a desired thickness. Each release layer 30 processed in the second processing step functions as the charge transport layer 23 (23a, 23b, or 23c) (FIG. 2M). As a result, the step of forming the charge transport layer can be simplified or omitted in subsequent steps. In addition, the thickness of the release layer (charge transport layer 23 (23a, 23b, or 23c)) after the second processing step can be appropriately changed in accordance with element design.

In the second processing step for the release layer, a mixing ratio between water and IPA is adjusted so that the etching rate of the release layer for the polar solvent may be higher than that of the organic compound layer. As a result, an end portion of the organic compound layer 22 (22a, 22b, or 22c) occurring in the unit of each sub-pixel after the step of processing the organic compound layer becomes hardly soluble in the solvent. Accordingly, when the supporting substrate 10 is lifted from the polar solvent after the performance of the second processing step for the release layer, only the release layer 30 can be processed while the shape of the organic compound layer 22 (22a, 22b, or 22c) is maintained. A charge transport layer such as an electron transport layer has only to be further separately formed as required.

After the performance of the second processing step for the release layer 30, the solvent remaining on the supporting substrate 10 provided with the organic compound layer 22 or on the organic compound layer 22 is preferably removed by heating the supporting substrate 10. The supporting substrate 10 is more preferably heated under a vacuum condition at about 80° C. When the solvent is removed by heating the supporting substrate 10 as described above, a charge injection layer or a charge transport layer can be formed in the next step in a state where the formation is not affected by the solvent. It should be noted that the supporting substrate 10 may be heated in a vacuum before the performance of the next step. The vacuum heating can also reduce an influence such as the adhesion of water, oxygen, or foreign matter in the atmosphere.

(Step of Forming Charge Injection/Transport Layer)

After the reprocessing of the release layer 30 (second processing step for the release layer 30) has been performed as described above, the charge injection/transport layer 24 is formed on the charge transport layer 23. It should be noted that the charge injection/transport layer 24 is preferably formed as a layer common to the respective sub-pixels.

When an electron injection layer is formed as the charge injection/transport layer 24, an electron injection material as a constituent material for the electron injection layer desirably has a high work function. Examples of such material include an alkali metal, an alkaline-earth metal, an alkali metal compound (oxide, carbonate, or halogenated salt), and a material obtained by doping an electron transport material with an alkali metal or an alkali metal compound. Here, cesium, potassium, and lithium can be given as specific examples of the alkali metal. In addition, specific examples of the alkaline-earth metal include calcium and barium.

On the other hand, when a hole injection layer is formed as the charge injection/transport layer 24, an organic compound having a small work function and an electron-withdrawing material having an extremely deep work function can be suitably given as examples of a hole injection material as a constituent material for the hole injection layer. An arylamine compound and phthalocyanine can be given as examples of the organic compound having a small work function. In addition, F4-TCNQ, an azatriphenylene compound (such as PPDN or hexacyano-hexaazatriphenylene), molybdenum oxide, and tungsten oxide can be given as examples of the electron-withdrawing material having a deep work function.

(Step of Forming Second Electrode)

When a top emission type organic EL display device is produced, the second electrode 25 corresponding to the upper electrode is a transparent electrode formed of a transparent conductive material. The transparent conductive material having light-transmitting property is preferably a material having a high light transmittance. Examples of such material include: transparent conductive materials such as ITO, IZO, and ZnO; and organic conductive materials such as a polyacetylene. It should be noted that a semitransmissive film obtained by forming a metal material such as Ag or Al into a film having a thickness of about 10 nm to 30 nm may be used as the second electrode 25. Here, when a light transmissive electrode is formed of a transparent conductive material such as ITO, IZO, or ZnO, composition that satisfies both a low resistance characteristic required for the composition to be used in an electrode and a high transmittance characteristic needed for an improvement in light extraction efficiency is preferred for a reduction in power consumption. A thin film to serve as the light transmissive electrode can be formed by a known method such as sputtering. When a transparent conductive film that brings together the low resistance characteristic and the high transmittance characteristic is produced, the volume of a film-forming apparatus, a target, the pressure in the apparatus, and an output voltage at the time of the film formation need to be appropriately adjusted. It should be noted that the second electrode 25 is electrically connected to a switching element such as a TFT (not shown).

(Regarding Driving of Organic EL Display Device)

The organic EL display device manufactured by the manufacturing method of the present invention can be driven by applying a voltage between the first electrode 21 and the second electrode 25 which each sub-pixel (20a, 20b, or 20c) has. Here, when the voltage is applied, for example, power source means (not shown) electrically connected to each electrode through a TFT is used.

Embodiment 2

Figure 5A:
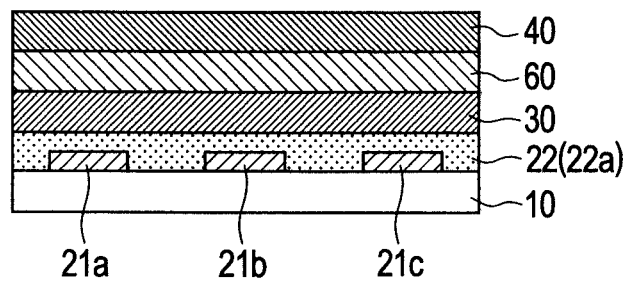
FIGS. 5A, 5B, 5C, 5D, and 5E are each a schematic sectional view illustrating Embodiment 2 in the method of manufacturing an organic EL display device of the present invention.

FIGS. 5A to 5E are each a schematic sectional view illustrating Embodiment 2 in the method of manufacturing an organic EL display device of the present invention. Here, Embodiment 2 differs from Embodiment 1 in that a protective layer 60 is formed on the release layer 30 after the step of forming the release layer 30 (FIG. 5A). Hereinafter, Embodiment 2 is described with particular emphasis on its difference from Embodiment 1.

(Step of Forming Protective Layer)

In the manufacturing method of the present invention, as illustrated in FIG. 5A, the protective layer 60 may be formed on the release layer 30 after the step of forming the release layer 30. Here, the protective layer 60 to be formed on the release layer 30 is a film insoluble in water and an organic solvent, and is preferably a film having moisture resistance and gas barrier property. Here, the protective layer 60 more preferably has such characteristic as to absorb light to be applied at the time of photolithography. The protective layer 60 to be formed in the manufacturing method of the present invention is preferably a thin-film layer of an inorganic compound using silicon nitride (SiN) as a main material.

By the way, the formation of the protective layer 60 on the release layer 30 eliminates the possibility that the solvent to be used upon formation of the photosensitive resin layer 40 in the next step permeates the release layer 30 to contact the organic compound layer 22. Accordingly, upon selection of the solvent of the photosensitive resin layer 40, such a restraint that the solvent should not dissolve the organic compound layer 22 is lifted, and hence an additionally cheap material can also be selected.

(Step of Processing Protective Layer)

Figure 5B:
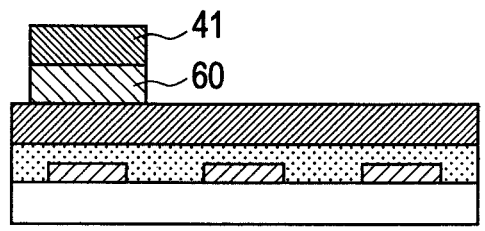

When the protective layer 60 is provided between the photosensitive resin layer 40 and the release layer 30, the processing of the protective layer 60 needs to be performed before the processing of the release layer 30 is performed. Here, the processing of the protective layer 60 is specifically selective removal of a region out of the protective layer 60 not covered with a photosensitive resin layer 41 (photosensitive resin not exposed in the exposing step) (FIG. 5B). Although a method of selectively removing the protective layer 60 is not particularly limited, a known technology such as wet etching or dry etching can be utilized. For example, when a constituent material for the protective layer 60 is SiN, dry etching involving using $CF_4$ as a reactant gas can be utilized.

(Step of Removing Protective Layer Etc.)

Figure 5C:
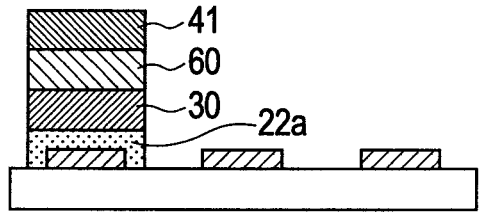

After the step of processing the protective layer 60 described above has been performed, the processing of the release layer 30 and the organic compound layer 22a is performed in the same manner as in Embodiment 1 (FIG. 5C). It should be noted that the removal of the photosensitive resin layer 41 may be simultaneously performed upon performance of the processing of the organic compound layer 22a.

Figure 5D:
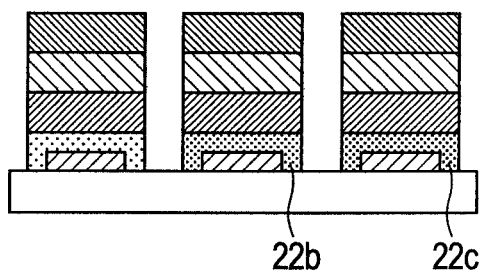
Figure 5E:
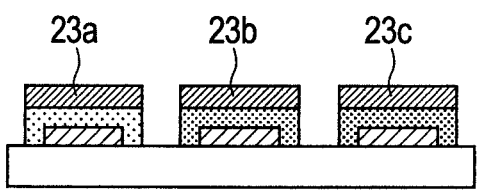

After that, the steps ranging from the formation of the organic compound layer (22b or 22c) to the processing of the organic compound layer are performed in each sub-pixel (FIG. 5D), and then the protective layer 60 and the release layer 30 are removed (FIG. 5E). When the protective layer 60 is provided between the release layer 30 and the photosensitive resin layer 40 like this embodiment, the protective layer 60 is removed by a method (such as dry etching or wet etching) utilized during the step of processing the protective layer after the removal of the photosensitive resin layer 40. The supporting substrate 10 after the removal of the protective layer 60 is immersed in a polar solvent, and then only the release layer 30 is processed while the shape of the organic compound layer 22 (22a, 22b, or 22c) is maintained. After only a certain thickness has been removed from the surface of the release layer 30, a charge transport layer such as an electron transport layer, a charge injection/transport layer, a second electrode, or the like is further separately formed as required in the same manner as in Embodiment 1.

Embodiment 3

Figure 6A:
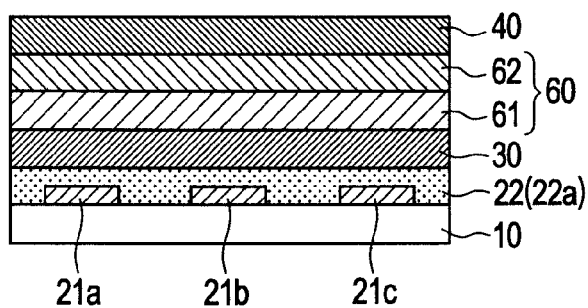
FIGS. 6A, 6B, 6C, 6D, 6E, and 6F are each a schematic sectional view illustrating Embodiment 3 in the method of manufacturing an organic EL display device of the present invention.

FIGS. 6A to 6F are each a schematic sectional view illustrating Embodiment 3 in the method of manufacturing an organic EL display device of the present invention. Here, Embodiment 3 differs from Embodiment 2 in that a protective layer 60 is formed of multiple layers (a first protective layer 61 and a second protective layer 62) (FIG. 6A). Hereinafter, Embodiment 3 is described with particular emphasis on its difference from Embodiment 2

(Step of Forming Protective Layer)

As illustrated in FIG. 5A and FIG. 6A, the protective layer 60 may be a single layer, or may be multiple layers. When the protective layer is a laminate formed of two layers, a first protective layer 61 to be formed first is preferably formed of a water-soluble material. In addition, a second protective layer 62 to be formed subsequently to the first protective layer 61 is preferably a film of an inorganic compound using, as a main material, a material insoluble in water and an organic solvent such as silicon nitride.

Examples of the water-soluble material as a constituent material for the first protective layer 61 include known water-soluble polymer materials such as a polyvinyl alcohol, a polyethylene glycol, and a polyvinyl pyrrolidone. In addition, an existing method such as a known spin coating method, dip coating method, or ink jet method can be employed upon formation of the first protective layer. Here, the organic compound layer 22 is not etched by a solvent upon formation of the first protective layer 61 because the organic compound layer 22 is a layer formed of a material that does not dissolve in water. In addition, when the protective layer 60 is formed so as to have a large thickness, an influence such as the dissolution of the organic compound layer 22 by the solvent of the photosensitive resin layer 40, a reduction in the thickness of the organic compound layer 22, or the elution of a luminescence material can be additionally alleviated.

(Step of Processing Protective Layer)

In addition, when the protective layer 60 is constituted of multiple layers, each protective layer needs to be processed. For example, when the protective layer 60 is a laminate obtained by laminating the first protective layer 61 formed of a water-soluble polymer and the second protective layer 62 formed of SiN in the stated order, each protective layer is processed by the following method. First, the second protective layer as an upper layer is subjected to dry etching involving using $CF_4$ as a reactant gas (FIG. 6B), and then the first protective layer as a lower layer is subjected to dry etching involving using $CF_4$ as a reactant gas (FIG. 6C).

(Step of Removing Protective Layer Etc.)

Figure 6B:
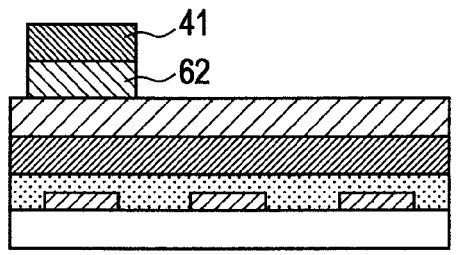
Figure 6C:
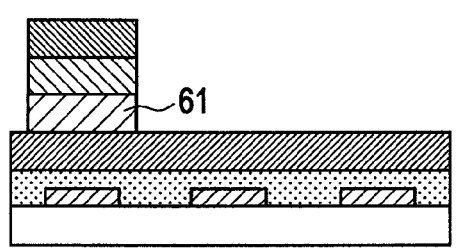
Figure 6D:
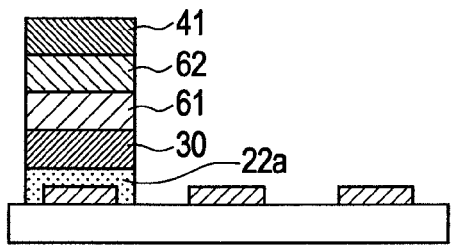

After the step of processing the protective layer 60 described above has been performed, the processing of the organic compound layer 22a is performed in the same manner as in Embodiment 2 (FIG. 6D). It should be noted that, as illustrated in FIG. 6D, the removal of the photosensitive resin layer 41 may be simultaneously performed upon performance of the processing of the organic compound layer 22a.

Figure 6E:
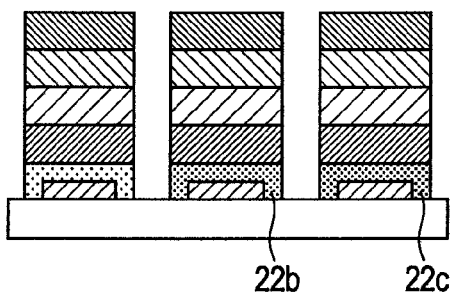
Figure 6F:
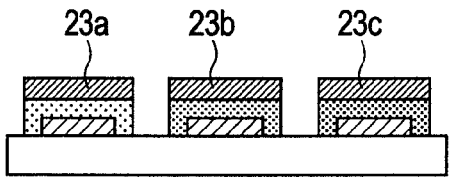

After that, the steps ranging from the formation of the organic compound layer (22b or 22c) to the processing of the organic compound layer are performed in each sub-pixel (FIG. 6E), and then the protective layer 60 and the release layer are removed (FIG. 6F). When the protective layer 60 is provided between the release layer 30 and the photosensitive resin layer 40 like this embodiment, the protective layer 60 is removed by a method (such as dry etching or wet etching) utilized during the step of processing the protective layer after the removal of the photosensitive resin layer 40.

Next, the present invention is described by way of examples. However, the present invention is not limited to the examples to be described below. For example, the order in which sub-pixels are formed in terms of their luminescent colors is not limited to the order "blue, green, and red." For example, the constitution and thickness of the organic compound layer are also not limited to the information described in the examples. For example, when an electron is injected from the first electrode, the order in which the layers of the organic compound layer are laminated in accordance with the injection has only to be adopted. A combination of the examples to be described below is also included in the present invention. A well-known or known technology in the technical field is applied to a portion not specifically illustrated or described in the specification.

(Electronic Equipment)

As explained above, the organic EL display device is excellent in current efficiency, drive life and fineness. Therefore, the organic EL display device of the present invention may be used for a display portion of various electronic equipment. The electronic equipment includes a digital camera, a portable equipment such as a personal digital assistant, a personal computer, a television set, and various printers.

Figure 7:
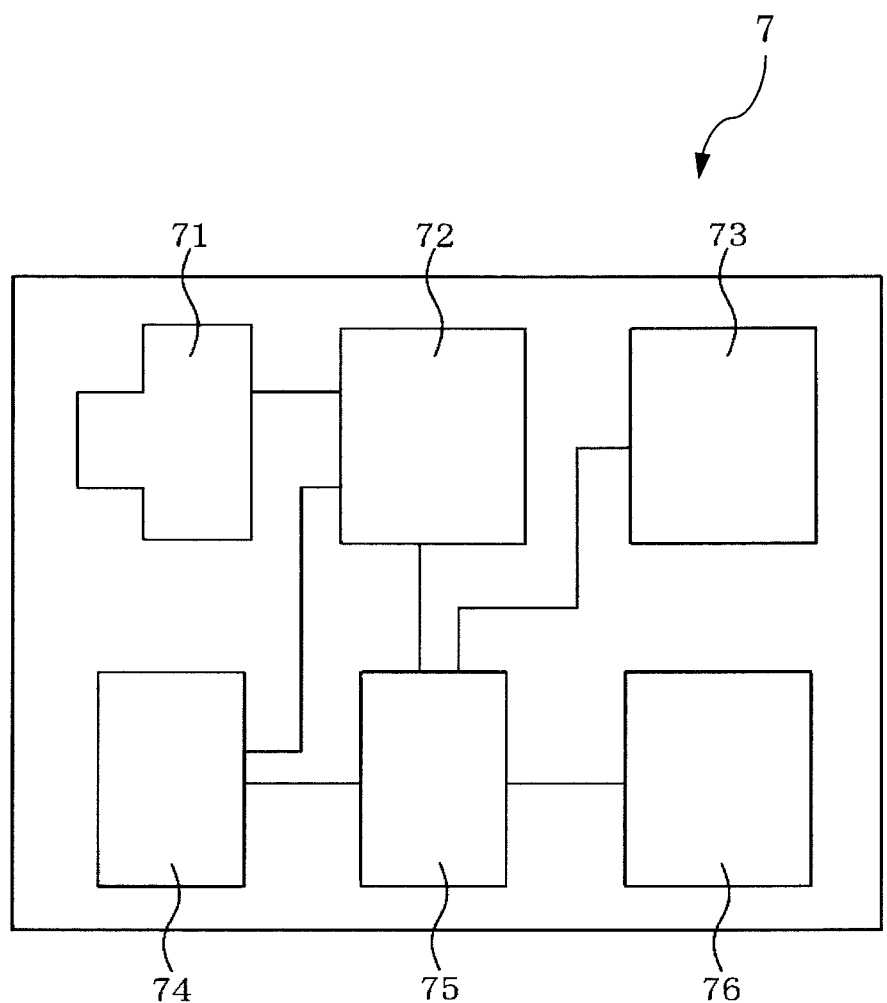
FIG. 7 is a block diagram illustrating an example of a digital camera system.

A digital camera as an example of the electronic equipment is described. FIG. 7 is a block diagram illustrating an example of a digital camera system. The digital camera system 7 includes a photographing portion 71, an image signal processing circuit 72, a display device 73, a memory 74, a CPU 75 and an operating portion 76. The display device 73 constituting the digital camera system 7 shown in FIG. 7 uses the organic EL display device produced by the method of the present invention.

The image photographed by using the photographing portion 71 and the image information stored in the memory 74 are signal processed by the image signal processing circuit 72 to be converted to an image signal, and then is transmitted to the display device 73 to be displayed as the image.

A controller (not shown) equipped to the digital camera system 7 shown in FIG. 7 is connected to CPU 75 for controlling the photographing portion 71, the memory 74 and the image signal processing circuit 72, whereby the digital camera system conducts photographing, recording, reproducing, displaying which are suitable for circumstances by an input signal from the operating portion 76.

Example 1

The organic EL display device illustrated in FIG. 1 was produced in accordance with the process illustrated in FIG. 2.

(1) Step of Forming First Electrode

By a sputtering method, an aluminum alloy (AlNd) was formed into a film on a supporting substrate 10 so that an AlNd film (reflecting electrode) was formed. At this time, the thickness of the AlNd film was set to 100 nm. Then, by a sputtering method, ITO was formed into a film on the AlNd film so that an ITO film was formed. At this time, the thickness of the ITO film was set to 10 nm. Note that, a laminate formed of the AlNd film and the ITO film functioned as the first electrode 21. Next, the first electrodes 21a, 21b, and 21c constituting the first sub-pixel, the second sub-pixel, and the third sub-pixel, respectively were each produced by performing the patterning of the first electrode 21 based on a photolithography process (FIG. 2A).

(2) Step of Forming Blue Organic Compound Layer

The blue organic compound layer 22a was formed on the supporting substrate 10 on which the patterned first electrodes (21a, 21b, and 21c) had been formed by continuous film formation involving employing a vacuum deposition method. First, a hole transport layer was formed so as to have a thickness of 120 nm, and then an emission layer containing a blue luminescence material was formed so as to have a thickness of 30 nm. Next, a condensed polycyclic hydrocarbon compound represented by the following formula 1 was formed into a film so that a buffer layer was formed. At this time, the thickness of the buffer layer was set to 10 nm. Thus, the organic compound layer 22a (blue organic compound layer) was formed (FIG. 2B).

formula 1

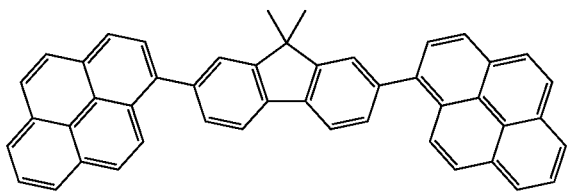

(3) Step of Forming Release Layer

Next, a phenanthroline derivative represented by the following formula 2 was formed into a film by a vacuum deposition method so that the release layer 30 was formed. At this time, the thickness of the release layer 30 was set to 500 nm (FIG. 2C).

formula 2

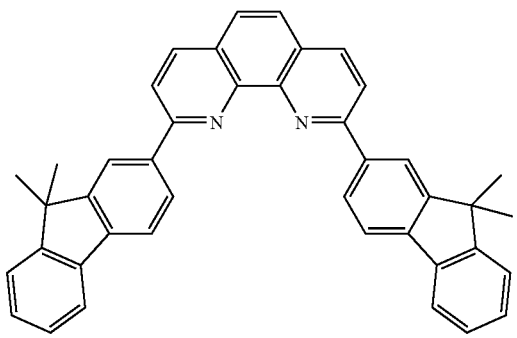

(4) Steps of Forming and Processing Photosensitive Resin Layer

Next, a positive photoresist (available under the product name "AZ1500" from AZ Electronic Materials) was formed into a film by a spin coating method so that the photosensitive resin layer 40 was formed (FIG. 2D). At this time, the thickness of the photosensitive resin layer was 1,000 nm. Next, exposure to the ultraviolet light 51 was performed with an exposure apparatus (Mask Aligner MPA600 manufactured by Canon Inc.) in a state where the photosensitive resin layer 41 provided for the region of the first sub-pixel 20a was shielded with the photomask 50 so that the photosensitive resin layer 41 was left (FIG. 2E). At this time, an exposure time was 40 s. After the exposure, development was performed with a developer (prepared by diluting a product available under the product name "312MIF" from AZ Electronic Materials with water so that its concentration was 50%) for 1 minute. A photosensitive resin layer 42 exposed to the ultraviolet light 51 was removed by the developing treatment.

(5) First Processing Step for Release Layer and Step of Processing Blue Organic Compound Layer Next, the release layer 30 not covered with the photosensitive resin layer 41 was removed and patterned with oxygen as a reactant gas under the conditions of a flow rate of 20 sccm, a pressure of 8 Pa, an output of 150 W, and a reaction time of 2 minutes. Thus, the patterned release layer 30 was formed in the region of the first sub-pixel 20a (FIG. 2F). Further, the blue organic compound layer 22a provided for the region except the region of the first sub-pixel 20a was selectively removed by dry etching under the same conditions. Thus, the organic compound layer 22a (blue organic compound layer) was formed in the region of the first sub-pixel 20a (FIG. 2G).

(6) Steps of Forming and Processing Red Organic Compound Layer

Next, the red organic compound layer 22b was formed by continuous film formation involving employing a vacuum deposition method. First, a hole transport layer was formed so as to have a thickness of 200 nm, and then an emission layer containing a red luminescence material was formed so as to have a thickness of 30 nm. Next, the condensed polycyclic hydrocarbon compound represented by the formula (1) was formed into a film so that a buffer layer was formed. At this time, the thickness of the buffer layer was set to 10 nm. Thus, the organic compound layer 22b (red organic compound layer) was formed. Next, the phenanthroline derivative represented by the formula (2) was formed into a film by a vacuum deposition method so that the release layer 30 was formed. At this time, the thickness of the release layer 30 was set to 500 nm. Next, the positive photoresist used in the step (4) was formed into a film by a spin coating method so that the photosensitive resin layer 40 was formed (FIG. 2H). At this time, the thickness of the photosensitive resin layer was 1,000 nm. Next, the photosensitive resin layer 40 was processed by the same method as that in the step (4), and then the release layer 30 and the organic compound layer 22b were processed by the same methods as those in the step (5). Thus, the organic compound layer 22b (red organic compound layer) was formed in the region of the second sub-pixel 20b (FIG. 2I).

(7) Steps of Forming and Processing Green Organic Compound Layer

Next, the green organic compound layer 22c was formed by continuous film formation involving employing a vacuum deposition method. First, a hole transport layer was formed so as to have a thickness of 160 nm, and then an emission layer containing a green luminescence material was formed so as to have a thickness of 30 nm. Next, the condensed polycyclic hydrocarbon compound represented by the formula (1) was formed into a film so that a hole blocking layer was formed. At this time, the thickness of the hole blocking layer was set to 10 nm. Thus, the organic compound layer 22c (green organic compound layer) was formed. Next, the phenanthroline derivative represented by the formula (2) was formed into a film by a vacuum deposition method so that the release layer 30 was formed. At this time, the thickness of the release layer 30 was set to 500 nm. Next, the positive photoresist used in the step (4) was formed into a film by a spin coating method so that the photosensitive resin layer 40 was formed (FIG. 2J). At this time, the thickness of the photosensitive resin layer was 1,000 nm. Next, the photosensitive resin layer 40 was processed by the same method as that in the step (4), and then the release layer 30 and the organic compound layer 22b were processed by the same methods as those in the step (5). Thus, the organic compound layer 22c (green organic compound layer) was formed in the region of the third sub-pixel 20c (FIG. 2K).

(8) Step of Removing Photosensitive Resin Layer

Next, the photosensitive resin layer 41 was removed by performing dry etching with oxygen as a reactant gas under the conditions of a flow rate of 20 sccm, a pressure of 8 Pa, and an output of 150 W (FIG. 2L).

(9) Second Processing Step for Release Layer

Performed next was a second processing step of removing a part of the release layer 30 with a mixed solvent obtained by mixing water and IPA so that an IPA concentration was 60 wt% to reduce the thickness of the release layer 30. It should be noted that as the etching rate of the compound (phenanthroline derivative represented by the formula (2)) constituting the release layer 30 in this example was 0.9 nm/sec, part of the release layer 30 was removed through immersion in the mixed solvent for 530 seconds so that the thinning was performed (FIG. 2M). As a result of the second processing step, the thickness of the release layer 30 became 20 nm. In addition, each release layer subjected to the thinning in the second processing step functions as the charge transport layer (electron transport layer) 23a, 23b, or 23c. Next, vacuum heating was performed at 80° C. so that the solvent remaining on the charge transport layer was removed.

(10) Step of Producing Second Electrode Etc.

Next, the compound represented by the formula (2) (compound A2) and cesium carbonate ($Cs_2CO_3$) were co-deposited from the vapor so that an electron injection layer (charge injection/transport layer) 24) was formed. At this time, the thickness of the electron injection layer was set to 20 nm (FIG. 2N).

Next, Ag as a semitransparent conductive material was formed into a film by sputtering so that the second electrode was formed (FIG. 2O). At this time, the thickness of the second electrode was set to 16 nm.

Next, a sealing glass (not shown) was bonded to the substrate under a nitrogen atmosphere so that a structure for preventing element deterioration was established. Thus, the organic EL display device was produced.

As a result of the evaluation of the organic EL display device 1 thus manufactured, current efficiency and a drive durability life for each of the three colors, i.e., the red, green, and blue colors were comparable to those of an organic EL display device produced through vacuum in-situ film formation. Therefore, the organic EL display device manufactured by the manufacturing method of the present invention is excellent in emission characteristic. Meanwhile, with regard to an increase in fineness, the acquisition of a pixel size of 12 μm was attained while a pixel size obtained by vapor deposition with a fine metal mask was about 100 μm.

Example 2

An organic EL display device was manufactured in the same manner as in Example 1 except the following. In Example 1, the following compound B1 (etching rate: 1.3 nm/sec) was used as a constituent material for the release layer 30. In addition, an immersion time in the IPA/water mixed solvent upon removal of the release layer 30 was set to 370 seconds.

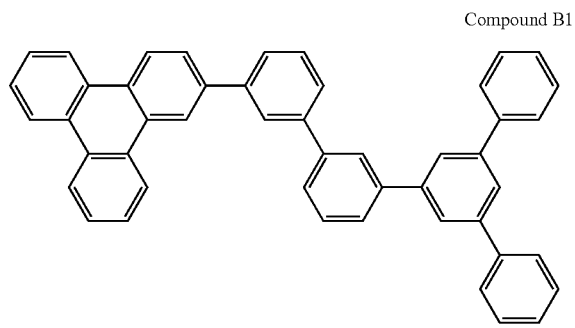 [SMILES: c1ccc(-c2cc(-c3ccccc3)cc(-c3cccc(-c4cccc(-c5ccc6c7ccccc7c7ccccc7c6c5)c4)c3)c2)cc1]

Compound B1

The resultant organic EL display device was evaluated by the same methods as those in Example 1. As a result, the device showed good results in terms of its current efficiency, drive life, and fineness as in Example 1.

Example 3

An organic EL display device was manufactured in the same manner as in Example 1 except the following. In Example 1, the following compound C1 (etching rate: 1.5 nm/sec) was used as a constituent material for the release layer 30. In addition, an immersion time in the IPA/water mixed solvent upon removal of the release layer 30 was set to 320 seconds.

example is described with reference to FIG. 5 with particular emphasis on the step of forming the protective layer, the step of processing the protective layer, and the step of removing the protective layer.

(1) Step of Forming Protective Layer Etc.

First, the layers up to the release layer 30 were formed on the supporting substrate 10 by the same methods as those in Example 1. Next, silicon nitride (SiN) was formed into a film by a CVD method on the release layer 30 so that the protective layer 60 was formed. At this time, the thickness of the protective layer 60 was set to 1,000 nm. Next, the photosensitive resin layer 40 was formed on the protective layer 60 by the same method as that in Example 1 (FIG. 5A).

(2) Step of Processing Protective Layer

Next, the photosensitive resin layer 40 was patterned. After that, the protective layer 60 not covered with the photosensitive resin layer 41 was removed with $CF_4$ as a reactant gas under the conditions of a flow rate of 30 sccm, an output of 150 W, a pressure of 10 Pa, and a treatment time of 7 minutes (FIG. 5B). That is, the protective layer 60 was processed in the step so that the protective layer 60 was provided in correspondence with the region of each sub-pixel.

(3) Step of Processing Organic Compound Layer Etc.

After that, the steps of processing the release layer 30 and the organic compound layer 22a were performed by the same methods as those in Example 1 (FIG. 5C). Next, the steps (1) and (2) were performed in each of the second sub-pixel 20b and the third sub-pixel 20c so that the organic compound

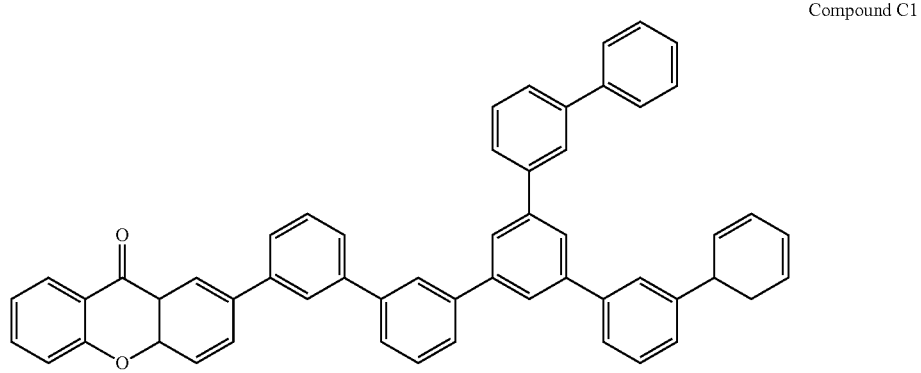 [SMILES: O=C1c2ccccc2OC2C=CC(c3cccc(-c4cccc(-c5cc(-c6cccc(-c7ccccc7)c6)cc(-c6cccc(C7C=CC=CC7)c6)c5)c4)c3)=CC12]

Compound C1

The resultant organic EL display device was evaluated by the same methods as those in Example 1. As a result, the device showed good results in terms of its current efficiency, drive life, and fineness as in Example 1.

Example 4

An organic EL display device was manufactured in the same manner as in Example 1 except the following. In Example 1, the step of forming the protective layer 60 was added between the step of forming the release layer 30 and the step of forming the photosensitive resin layer 40 to be performed upon processing of the organic compound layer (22a, 22b, or 22c). In addition, the step of processing the protective layer 60 was added between the step of processing the photosensitive resin layer 40 and the step of processing the release layer 30. Further, the step of removing the protective layer 60 was added between the step of removing the photosensitive resin layer 41 and the step of removing the release layer 30. Hereinafter, a manufacturing process in this layers 22b and 22c to be provided for the second sub-pixel 20b and the third sub-pixel 20c, respectively were formed and processed (FIG. 5D).

(4) Step of Removing Protective Layer

Next, the photosensitive resin layer 41 was removed by the same method as that in Example 1. After that, the protective layer 60 was removed with $CF_4$ as a reactant gas under the conditions of a flow rate of 30 sccm, an output of 150 W, a pressure of 10 Pa, and a treatment time of 7 minutes. Next, part of the release layer 30 was removed by the same method as that in Example 1 so that thinning was performed. Thus, each of the charge transport layers 23a, 23b, and 23c was formed (FIG. 5E). Next, the charge injection/transport layer 24 and the second electrode 25 were formed in the stated order by the same methods as those in Example 1. Thus, the organic EL display device was obtained.

The resultant organic EL display device was evaluated by the same methods as those in Example 1. As a result, the device showed good results in terms of its current efficiency, drive life, and fineness as in Example 1.

Example 5

In this example, an organic EL display device was manufactured in the same manner as in Example 4 except that the step of forming the protective layer, the step of processing the protective layer 60, and the step of removing the protective layer 60 in Example 4 were changed to methods to be described below. Hereinafter, description is given with reference to FIG. 6 with particular emphasis on the step of forming the protective layer, the step of processing the protective layer, and the step of removing the protective layer.

(1) Step of Forming Protective Layer

First, the layers up to the release layer 30 were formed on the supporting substrate 10 by the same methods as those in Example 4. Next, an aqueous solution of a polyvinyl pyrrolidone (PVP, molecular weight: 360,000) as a water-soluble polymer material was prepared by mixing the PVP and water so that the weight concentration of the PVP was 5 wt %. Next, the prepared aqueous solution of the PVP was applied onto the release layer 30, and was then formed into a film by a spin coating method so that the first protective layer 61 was formed. At this time, the thickness of the first protective layer 61 was 500 nm. Next, silicon nitride (SiN) was formed into a film by a CVD method on the first protective layer 61 so that the second protective layer 62 was formed. At this time, the thickness of the second protective layer 62 was set to 1,000 nm. Next, the photosensitive resin layer 40 was formed on the protective layer 60, which was obtained by laminating the first protective layer 61 and the second protective layer 62 in the stated order, by the same method as that in Example 4 (FIG. 6A).

(2) Step of Processing Protective Layer Etc.

After the photosensitive resin layer 40 had been patterned, the processing of the second protective layer 62 (selective removal of the second protective layer 62) was performed under conditions identical to those of the step (2) of Example 4 (FIG. 6B). Next, the first protective layer 61 not covered with the photosensitive resin layer 41 was removed with oxygen as a reactant gas under the conditions of a flow rate of 20 sccm, a pressure of 8 Pa, an output of 150 W, and 5 minutes. That is, the protective layer 60 formed of the first protective layer 61 and the second protective layer 62 was processed in the step so that the protective layer 60 was provided in correspondence with the region of each sub-pixel (FIG. 6C to FIG. 6E).

(3) Step of Removing Protective Layer Etc.

After the photosensitive resin layer 41 had been removed, the second protective layer 62 was removed under conditions identical to those of the step (4) of Example 4. Next, the first protective layer 61 was removed with oxygen as a reactant gas under the conditions of a flow rate of 20 sccm, a pressure of 8 Pa, an output of 150 W, and 5 minutes. Next, part of the release layer 30 was removed by the same method as that in Example 4 so that thinning was performed. Thus, the charge transport layer 23 was formed (FIG. 6F). After that, the charge injection/transport layer 24 and the second electrode 25 were formed in the stated order by the same methods as those in Example 4. Thus, the organic EL display device was obtained.

The resultant organic EL display device was evaluated by the same methods as those in Example 1. As a result, the device showed good results in terms of its current efficiency, drive life, and fineness as in Example 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-099394, filed Apr. 27, 2011, and Japanese Patent Application No. 2012-068007, filed Mar. 23, 2012, which are hereby incorporated by reference herein in their entirety.

What is claimed is:

1. A method of manufacturing an organic electroluminescence display device comprising an organic electroluminescence element including a first electrode and a second electrode, and an organic compound layer arranged between the first electrode and the second electrode, the organic compound layer being patterned, the method comprising:
   an organic compound layer-forming step of forming the organic compound layer at least on the first electrode;
   a release layer-forming step of forming a release layer on the organic compound layer;
   a first processing step for the release layer of patterning the release layer;
   an organic compound layer-processing step of removing the organic compound layer in a region not covered with the release layer processed in the first processing step for the release layer; and
   a second processing step for the release layer of removing a part of the release layer,
   wherein the release layer comprises a deposited film formed of a charge-transportable organic compound, and is soluble in a polar solvent.

2. The method of manufacturing an organic electroluminescence display device according to claim 1, wherein the polar solvent comprises a solvent obtained by mixing water and a polar solvent miscible with the water.

3. The method of manufacturing an organic electroluminescence display device according to claim 1, wherein a film formed in the second processing step for the release layer is used as a charge transport layer.

4. The method of manufacturing an organic electroluminescence display device according to claim 1, wherein the release layer comprises a heterocyclic compound.

5. The method of manufacturing an organic electroluminescence display device according to claim 1, wherein the release layer comprises a charge-transportable compound having an electron-withdrawing group.

6. The method of manufacturing an organic electroluminescence display device according to claim 1, wherein the release layer comprises a compound having an m-terphenyl group and a condensed ring group.

7. The method of manufacturing an organic electroluminescence display device according to claim 1, wherein the following equation:

$$n = \frac{[\text{Etching rate of release layer}]}{[\text{Etching rate of organic compound layer}]} > 10$$

where n is a ratio of etching rates is established.

8. The method of manufacturing an organic electroluminescence display device according to claim 1, further comprising the step of forming a layer containing an alkali metal after the second processing step for the release layer.

9. An organic electroluminescence display device manufactured by the manufacturing method according to claim 1.

10. An electronic equipment comprising:
    a photographing portion for photographing an image;
    a memory for recording the photographed image;

an image signal processing circuit for converting the image photographed in the photographing portion and an image information recorded in the memory to image signal;

a CPU for controlling the photographing portion, the memory and the image signal processing circuit;

an operating portion for inputting signal which controls the CPU; and a display device for displaying the image signal transmitted from the image signal processing circuit as an image, in accordance with the signal from the CPU, wherein the display device is the organic electroluminescence display device according to claim 9.

* * * * *